US007436160B2

(12) United States Patent
Rusu et al.

(10) Patent No.: US 7,436,160 B2
(45) Date of Patent: Oct. 14, 2008

(54) HALF BRIDGE ADAPTIVE DEAD TIME CIRCUIT AND METHOD

(75) Inventors: Iulia Rusu, Redondo Beach, CA (US); Dana Wilhelm, Temple City, CA (US); Peter Green, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 35 days.

(21) Appl. No.: 11/062,010

(22) Filed: Feb. 18, 2005

(65) Prior Publication Data
US 2005/0184714 A1    Aug. 25, 2005

Related U.S. Application Data

(60) Provisional application No. 60/546,361, filed on Feb. 19, 2004.

(51) Int. Cl.
*G05F 1/575*    (2006.01)
*H02M 7/537*    (2006.01)

(52) U.S. Cl. ...................... 323/284; 363/131; 327/109

(58) Field of Classification Search ................ 323/284, 323/283, 282, 223; 327/394, 393, 109; 363/16, 363/131
See application file for complete search history.

(56) References Cited

U.S. PATENT DOCUMENTS 6,310,466 B1 * 10/2001 Criscione .................... 323/222

(Continued)

OTHER PUBLICATIONS

Texas Instruments datasheet, TPS5210 Programmable Synchronous Buck Regulator, May 1999, SLVS171A, pp. 1-3.*

(Continued)

*Primary Examiner*—Jeffrey L. Sterrett
*Assistant Examiner*—Harry Behm
(74) *Attorney, Agent, or Firm*—Ostrolenk, Faber, Gerb & Soffen, LLP

(57) ABSTRACT

A high voltage offset detection circuit registers the voltage at the midpoint of a switching half-bridge and may determine when the midpoint voltage reaches a given value to avoid hard-switching in the half-bridge switches. The midpoint voltage of the switching half-bridge is applied through a buffer to a MOSFET that is current limited to produce a voltage that reflects the voltage of the midpoint of the switching half-bridge. The voltage produced by the MOSFET may be supplied to a comparator with a threshold input to obtain a signal that indicates when the switches of the switching half-bridge may be turned on to avoid hard-switching. An adaptive dead-time circuit and method may comprise the above sensing circuit, a first circuit for generating a first signal indicative of a high to low transition of the midpoint voltage; and an output circuit for generating an adaptive dead-time output signal based thereon. A second circuit may generate a second signal indicative of a low to high transition of the voltage; wherein the output circuit generates the adaptive dead-time output signal based on both the first and second signals. The second circuit preferably generates the second signal by reproducing the first signal. The first circuit may generate the first signal by charging a capacitor in response to pulses, and the second circuit may generate the second signal by charging a second capacitor corresponding to said first capacitor, and the adaptive dead-time output signal may be responsive to the charges on the first and second capacitors.

16 Claims, 7 Drawing Sheets

U.S. PATENT DOCUMENTS

| | | | |
|---|---|---|---|
| 6,348,780 B1 * | 2/2002 | Grant | 323/222 |
| 6,396,250 B1 * | 5/2002 | Bridge | 323/283 |
| 6,580,627 B2 * | 6/2003 | Toshio | 363/98 |
| 6,737,842 B2 * | 5/2004 | Bai et al. | 323/282 |
| 6,940,262 B2 * | 9/2005 | Dequina et al. | 323/284 |
| 2004/0012346 A1 * | 1/2004 | Green et al. | 315/291 |

OTHER PUBLICATIONS

WO 2003/059017 Peter Green, Basic Halogen Converter IC, July 17, 2003, WIPO, pp. 1-53.*

* cited by examiner

HALF BRIDGE ADAPTIVE DEAD TIME CIRCUIT AND METHOD

CROSS-REFERENCE TO RELATED APPLICATIONS

This application is based upon and claims priority of U.S. Provisional Application Ser. No. 60/546,361 filed by the present inventors Tulia RUSU et al. on Feb. 19, 2004 (IR-2198 PROV), incorporated by reference. It is related to U.S. Ser. No. 10/806,688 filed by Dana WILHELM on Mar. 23, 2004 (IR-2461), also incorporated by reference.

BACKGROUND OF THE INVENTION

1. Field of the Invention

The present invention relates to an adaptive deadtime method and circuit implementation, particularly for use in a half bridge driver IC such as the IR-2161 Halogen Convertor Control IC described in U.S. Provisional Application Ser. No. 60/343,236 filed Dec. 31, 2001 (IR-2082 PROV), U.S. Provisional Application Ser. No. 60/398,298 filed Jul. 22, 2002 (IR-2082 PROV II) and U.S. Ser. No. 10/443,525 filed May 21, 2003 (IR-2082), each incorporated by reference.

The invention also relates to a high voltage offset detection circuit that can be incorporated along with a half-bridge gate driver circuit, particularly in a monolithic solution.

2. Related Art

A self-oscillating half bridge circuit based on bipolar power transistors or other switching power devices will be inherently efficient because the system will always be soft switching. These circuits are well known and will not be explained here. In order to achieve similar performance in a half bridge circuit where a separate oscillator drives a low and high side driver, soft switching is not inherent, so the dead time is preferably fixed to a value which corresponds to the half bridge slew time. This varies depending on the capacitances and inductances in the output circuit as well as the load current.

High voltage half-bridge driver circuits are used in various applications such as motor drives, electronic ballasts for fluorescent lamps and power supplies. The half-bridge circuits employ a pair of totem pole connected transistors that are placed across a high voltage DC power supply. The schematic in FIG. 1 shows a basic half-bridge circuit. Transistors M1 and M2 are the power devices (MOSFETS) and their midpoint connection, node "A", is the output that is connected to the load. The transistors M1 and M2 has their own gate drive buffers (DRV1 and DRV2 respectively) which supply the proper signals to turn transistors M1 and M2 on or off.

In various applications it is of great value to know when the midpoint of the output half-bridge, node A, has transitioned from a high state to a low state or a low state to a high state. Such an application is an electronic ballast for a fluorescent lamp. A simplified schematic of such a ballast is shown in FIG. 2. As can be seen, the load on the half-bridge is a resonant circuit consisting of L1, C1 and LAMP1. During operation transistors M1 and M2 are alternatively switched on and off which causes current to build in the resonant load circuit that is connected to node A. For example: when M1 is turned on, the voltage at node A is pulled (slews) to the potential of the DC high voltage bus and current will begin to build in the resonant load. When M1 is switched off, the current flowing in the resonant load causes the voltage at node A to slew towards a lower potential. It is assumed that the switching frequency of the half-bridge is greater than the resonant frequency of the load circuit. After some "dead-time" delay, transistor M2 is turned on and the voltage at node A is pulled to the lower DC bus voltage which is typically zero potential. The dead-time delay prevents M1 and M2 from being on at the same time, which would cause a short circuit.

The slewing of the voltage at node A, prior to the turn on of M2, will take some finite amount of time to completely transition from the DC high voltage bus potential to the lower DC bus voltage. Under certain conditions the voltage at node A may not have completely transitioned to the lower potential at the time when M2 is turned on. In this case M2 will then pull the voltage at node A to the lower voltage.

This so called "hard-switching" is a source of switching loss and will cause heating of the half-bridge transistors M1 and M2, which could lead to their failure.

In order to minimize the switching losses, hard-switching can be prevented by ensuring that the voltage at node A has completely transitioned prior to the turn on of M2. This can be arranged by increasing the dead-time delay between the turn off of M1 (M2) and the turn on of M2 (M1), or by decreasing the effective capacitive loading at node A. These measures however may reduce switching speed or the available lamp rating.

SUMMARY OF THE INVENTION

For further improvement, the circuit and method disclosed herein provide an adaptive dead time function which may be implemented, for example, in the design of a halogen converter (electronic transformer) control IC, and in many other applications.

One aspect of this function is a method and system for detecting the voltage potential at node A, which may be integrated into a monolithic solution. The circuit requires no additional external components and therefore simplifies the final application circuit. The circuit is adapted to be incorporated into a high voltage self-oscillating half-bridge gate driver IC, in particular one in which the high voltage half-bridge gate drive buffers and the level translation are contained in a monolithic integrated circuit. In such a circuit, the high side gate drive buffer DRV1, which is referenced to node "A", is preferably arranged in an insulated high-side well that can float up to the DC high voltage potential.

According to a feature of the present invention, a signal indicating a safe threshold for switching is provided to avoid hard-switching in the half-bridge. The signal can be provided based on comparison with a programmable threshold level that can optionally be provided for specific switch parameters for specific applications.

According to another feature of the invention, a high voltage switch is provided to obtain a sense of the voltage at node A of the half-bridge. The high voltage switch can be controlled to turn on or off to measure the voltage at the half-bridge node A.

According to another feature of the invention, the voltage at the half-bridge node A is transferred to a high voltage sense circuit that is powered by a low side voltage of the half-bridge, providing a low voltage sense circuit that can withstand high voltages.

According to another feature of the present invention, the voltage measuring circuit senses voltage based on a switch turn on and a threshold comparison.

According to other aspects of the invention, an adaptive dead-time circuit for an oscillator-driven half-bridge circuit may comprise a sensing circuit for sensing a voltage at a midpoint of a switching half-bridge; a first circuit for generating a first signal indicative of a high to low transition of said voltage; and an output circuit for generating an adaptive deadtime output signal based at least on said first signal, said output signal being adapted for controlling said oscillator. A second circuit advantageously generates a second signal indicative of a low to high transition of said voltage; wherein said output circuit generates said adaptive dead-time output signal based on both said second signal and said first signal.

The first circuit may generate a first pulse near the beginning of said high-to-low transition and a second pulse near the end of said transition, and generates said first signal based on said first and second pulses. The second circuit preferably generates said second signal by reproducing said first signal. The first circuit may generate said first signal by charging a capacitor in response to said first and second pulses to generate a charge indicative of said high-to-low transition, and said second circuit may generate said second signal by charging a second capacitor to generate a charge corresponding to said charge on said first capacitor, thereby indicating said low-to-high transition; and said output circuit may accordingly generate said adaptive dead-time output signal in response to said charges on said first and second capacitors, whereby said output signal is adapted for controlling said oscillator in response to said high-to-low and low-to-high transitions at said half-bridge midpoint.

Other features and advantages of the present invention will become apparent from the following description of embodiments of the invention, which refers to the accompanying drawings.

DETAILED DESCRIPTION OF EMBODIMENTS OF THE INVENTION

Half-Bridge Midpoint Voltage Sensing

Figure 1:
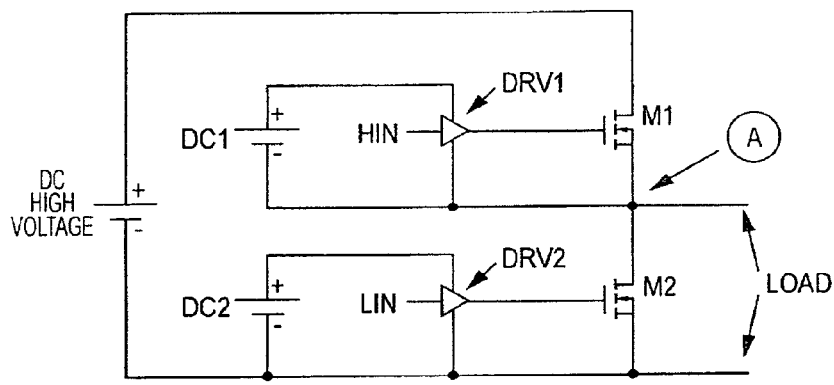
FIG. 1 is a simplified schematic diagram of a conventional half-bridge circuit.
Figure 2:
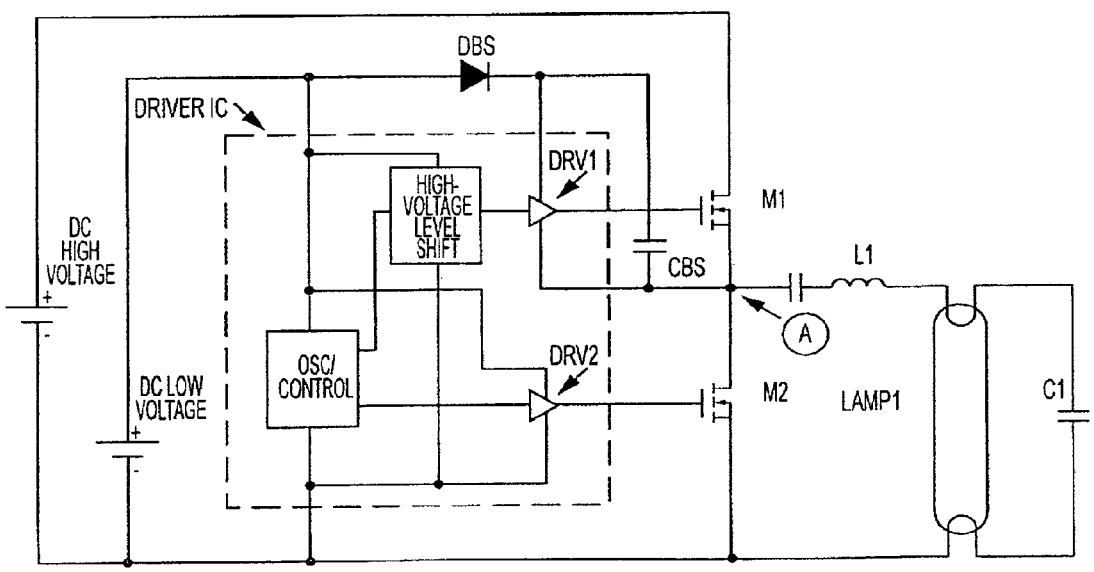
FIG. 2 is a simplified schematic diagram of a conventional electronic ballast.
Figure 3:
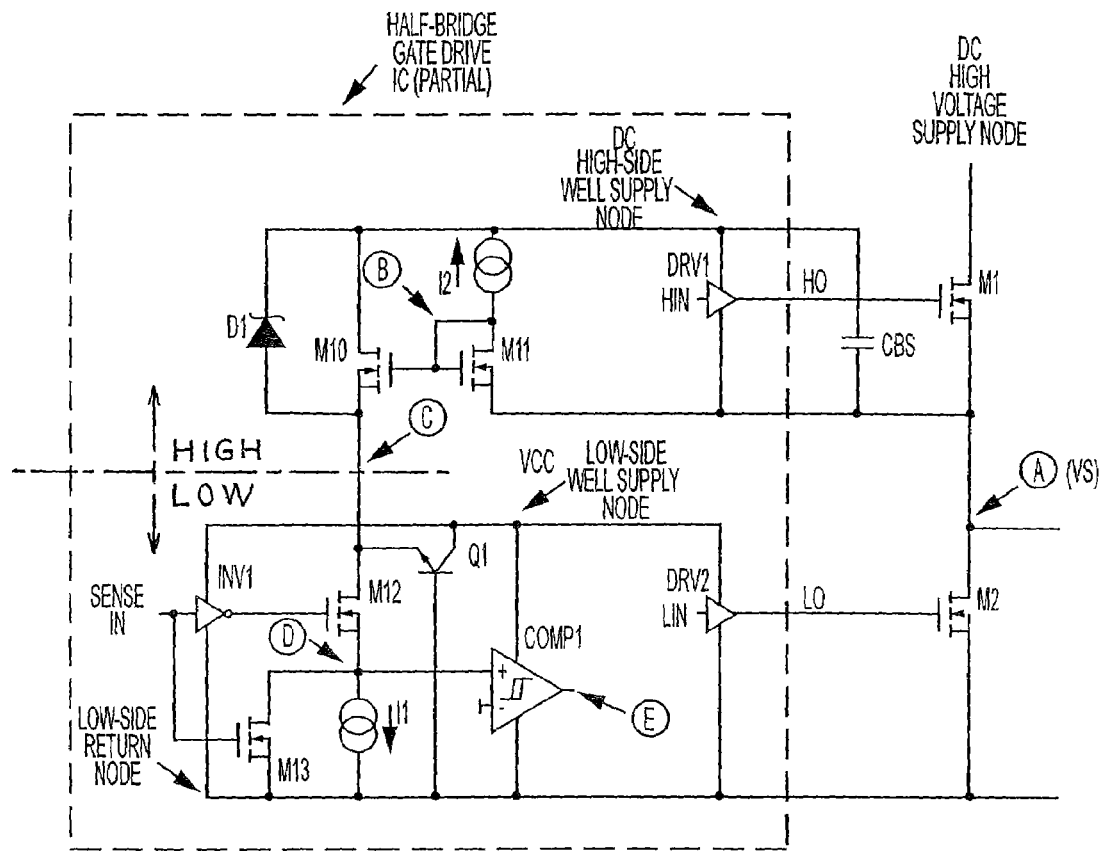
FIG. 3 is a schematic diagram of a half-bridge midpoint voltage sensing circuit according to a first embodiment of the invention.

FIG. 3 is a schematic diagram of a half-bridge midpoint node A voltage sensing arrangement according to a first embodiment of the invention, also described in the above-referenced U.S. Ser. No. 10/806,688. The circuitry enclosed within the broken line is included within the monolithic solution; note that the circuitry shown emphasizes the new sensing circuit. Additional gate drive circuitry that may be included in a complete half-bridge gate driver may not be shown, as it does not affect the invention.

To sense the voltage at node A, a device that is capable of withstanding up to the high DC bus voltage is needed. The device used is M12, which is a high voltage LDMOS transistor. Transistor M12 is switched synchronously with the high-side output that drives transistor M1. When transistor M1 is turned on, M12 is turned off by supplying a logic level high to the Sense In node. During the time the transistor M1 is on, the voltage at node A will be effectively the same as the DC high voltage supply. However, when transistor M1 is turned off, the voltage at node A may be anywhere between the DC high voltage supply and zero. Also, depending on the reactive load connected to node A, the voltage may possibly go below zero with respect to the return node. The node A voltage magnitude is equivalent to the voltage at node C as will be explained below, and the voltage at node C is level shifted to the low side through transistor M12 and appears at node D.

The voltage at node D only has a range of zero to VCC (low-side well supply voltage). Therefore, at any time that transistor M1 is turned off and the voltage at node A is greater than VCC, the voltage at node D will be equal to VCC. However, once the voltage at node A falls below the VCC magnitude, the voltage at node D is equivalent to the voltage at node A.

This node D voltage may then be connected to an input of a comparator such as COMP1 shown in FIG. 3 and compared to a threshold, which may be adjustable and/or may be set to zero. The output E of the comparator COMP1 may then be used to signal that the voltage at the midpoint of the half-bridge, node A, has reached a level that for all practical purposes is low enough that there will be no hard-switching in the half-bridge transistors M1 and M2. This comparator output can be connected to the control logic of the half-bridge driver and action can thereby be taken to prevent or minimize the potential hard-switching losses in the half-bridge transistors.

When the Sense In node is connected to a logic high level, the gate of transistor M12 is held to zero volts by INV1. The source/body terminal, node D, of transistor M12 is also held to zero volts by transistor M13. This causes transistor M12 to be off and no current flows in its drain. When the Sense In node is pulled to a logic low level, the gate of transistor M12 is pulled to VCC by INV1. At this same time transistor M13 is turned off and node D is pulled toward zero volts by current source I1. Transistor M12 turns on and current begins to flow; note that this assumes that the voltage magnitude at node C is greater than zero. Transistor M12 is connected as a source follower and since its drain voltage, node C, is greater than zero, the voltage at node D rises to approximately the same magnitude supplied by current source I1. If the voltage at node C is greater then the magnitude of VCC, the voltage at node D will rise towards VCC. As the voltage at node D approaches VCC minus the turn on threshold of M12, M12 will enter its saturation region of operation with a current magnitude equal to that supplied by current source I1. This limits the voltage at node D to a voltage level that is always lower that VCC. The difference of the voltage magnitude between the voltage at node C and node D appears across transistor M12, which being a high voltage LDMOS device, can withstand large voltage differences.

The voltage at node C is supplied by source follower connected transistor M10. The voltage at node C is equal to the voltage at node B minus the turn on threshold of transistor M10. The voltage at node B is derived from the diode connected transistor M11 whose source/body terminal is connected to node A. The voltage at the gate/drain connection of transistor M11, node B, is pulled high by current source I2. Therefore the voltage at node B is equal to the voltage at node A plus the turn on threshold of transistor M 11. The magnitude of current sources I1 and I2 are chosen to be equal and transistors M10 and M11 are matched. With equal current flowing in the drains of transistors M10 and M11, the turn on thresholds of M10 and M11 are equivalent. By extrapolation it can be seen that the voltage at node C is then equivalent to the voltage at node A.

Adaptive Dead-Time Function

The adaptive dead time function (FIG. 4-7) senses the voltage VS at the MOSFET half-bridge midpoint (called node A in the previous discussion). When the high side MOSFET is switched off the voltage at VS will slew to 0V due to the output inductance and the drain to source capacitances of the MOSFETs. When the voltage VS reaches a low magnitude near 0V it is the correct time for the lower MOSFET to switch on. The integrated high voltage offset detection circuit described in connection with FIG. 3 produces a signal at a node C at the low side circuitry of the IC that follows VS from the point where it slews below VCC and provides reference information for zero voltage detection.

Figure 4:
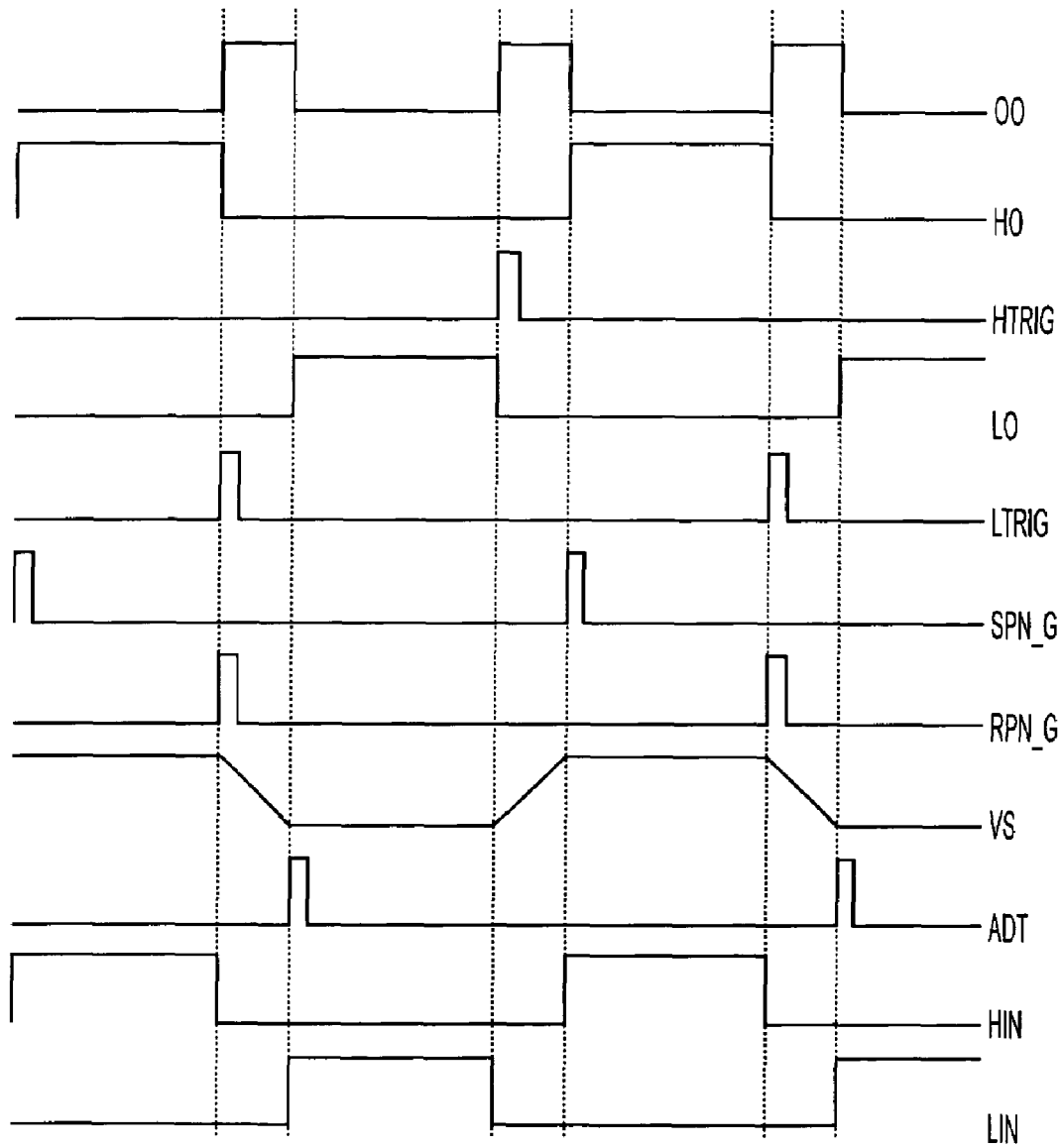
FIG. 4 is a series of graphs showing signals present during operation of the adaptive dead time circuit.
Figure 5:
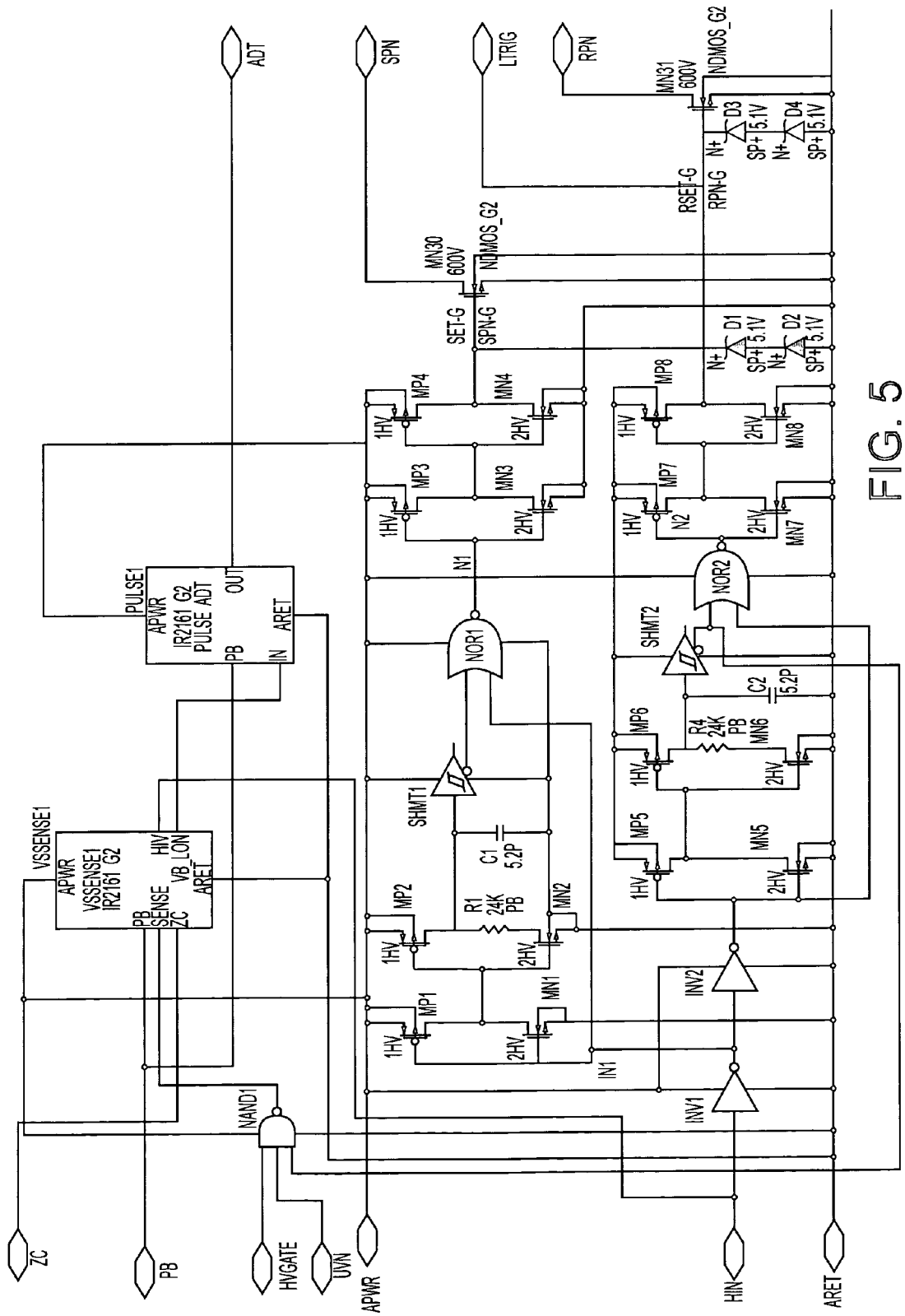
FIG. 5 is a schematic diagram of a pulse generating circuit PGEN.

The waveform VS is shown in FIG. 4, which also shows the pulses SPN-G and RPN-G that feed the gates of MN30 and MN31 of FIG. 5 respectively, which produce the SPN and RPN inputs which set and reset the high side output HO.

Referring to FIG. 4, it can be seen that a pulse LTRIG occurs at the beginning of the high to low transition of VS and a pulse ADT occurs when the voltage at VS slews almost to 0V. The period between these pulses will determine the dead time.

Figure 6:
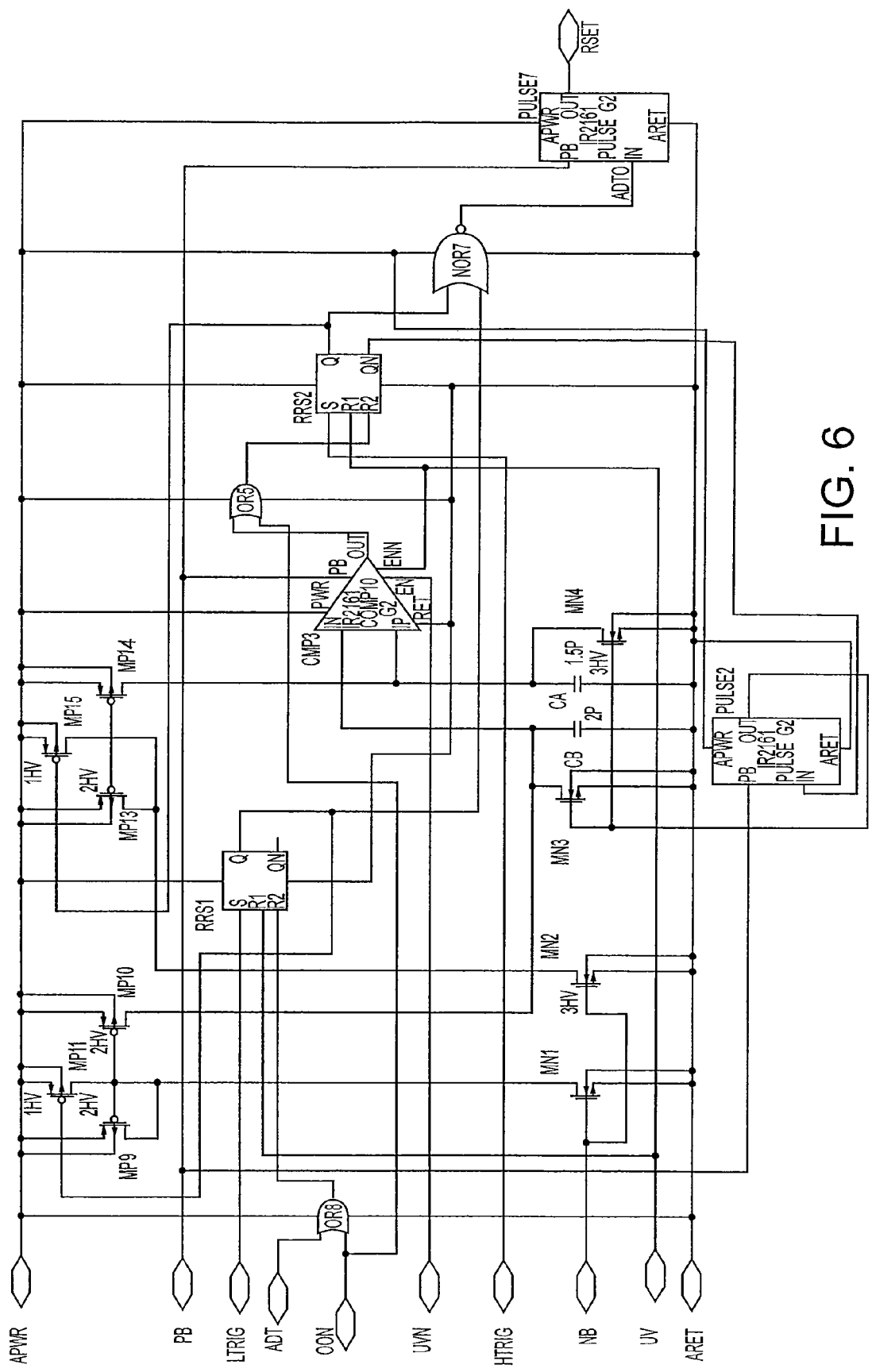
FIG. 6 is a schematic diagram of an adaptive dead time circuit.

These signals are fed into the adaptive dead time circuit of FIG. 6. RRS1 is set by LTRIG and reset by ADT or OON from the oscillator if for some reason a high to low transition is not detected, defaulting the system to a fixed dead time. When RRS1 is set, MP11 switches off and the current mirror made up of MP9 and MP10 sources current to capacitor CB. Consequently a voltage will be present on CB proportional to the detected high to low slew time of VS.

Since it is not possible to sense the low to high slew time in the same way, the system determines the correct dead time by reproducing the high to low slew time, which can be assumed to be similar. When LO goes low, the HTRIG pulse occurs which sets flip-flop RRS2, shown in FIG. 6. At this point MP15 switches off and another identical current source made up of MP13 and MP14 is enabled and CA begins to charge. When the voltage on CA exceeds the voltage on CB the output of comparator CMP3 will go high, thus duplicating the high to low slew time. When the output of CMP3 goes high, flip-flop RRS2 is reset, thereby producing the correct dead time pulse for the low to high transition at the Q output of RRS2. The Q outputs from flip-flops RRS 1 and RRS2 are fed into the NOR gate NOR7 to produce the ADTO output which provides a signal that is low during either dead time, and high when either LO or HO is high. The ADTO signal produces a pulse at the RSET output at the end of each dead time, which is fed back to the oscillator, to discharge the timing capacitor CT (not shown) and begin the next cycle. To provide for this facility, the oscillator is of a type where a ramp waveform is generated such that as the voltage is rising on CT, the outputs LO and HO will be high alternately, and as the voltage on CT is falling both LO and HO will be low. This type of oscillator and output logic is used in most of the half bridge driver IC's produced by International Rectifier and therefore need not be described further.

Figure 7:
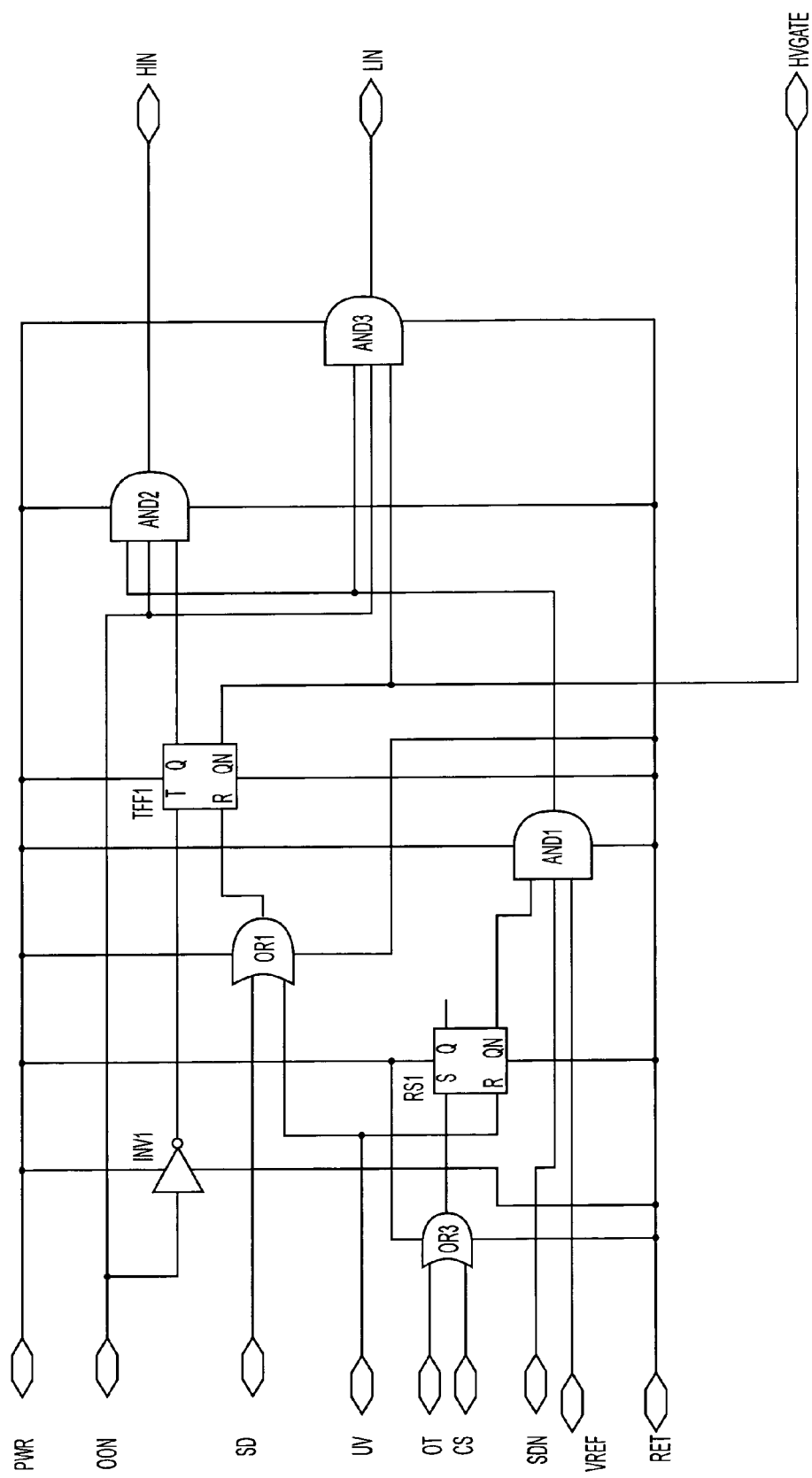
FIG. 7 is a logic diagram of an output logic circuit.
Figure 8:
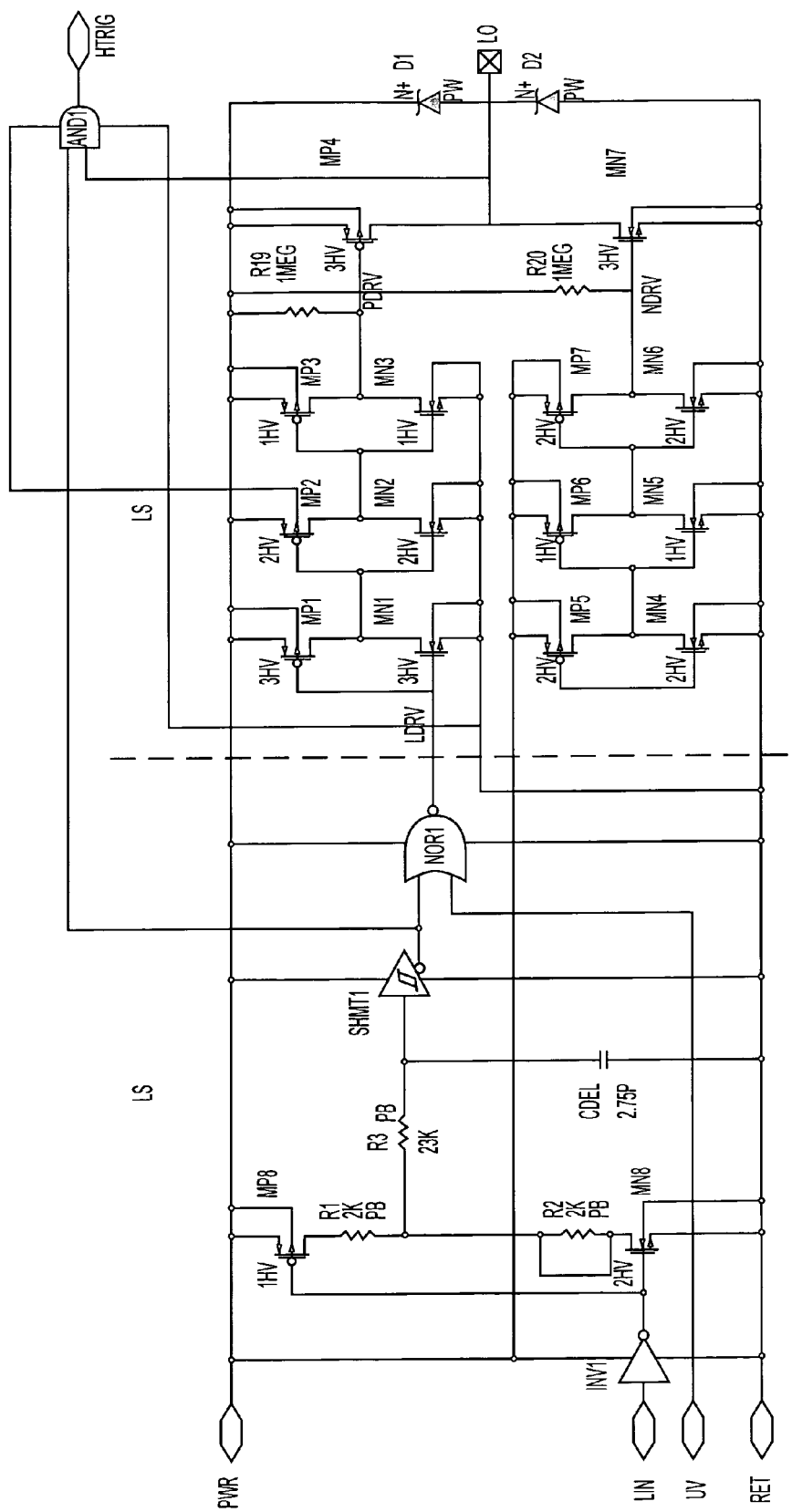
FIG. 8 is a schematic diagram of a low side driver circuit.

In this way the oscillator output OO, shown in FIG. 4, will follow the adaptive dead time circuit and can be inverted and then fed to the output logic circuit shown in FIG. 7, via signal OON which provides blanking of LO and HO via the AND gates, AND2 and AND3.

In FIG. 7, the CS input is for latching off the outputs when a high VCS (current sense pin voltage) is sensed, as in the case of cold cathode lamps.

Although the present invention has been described in relation to particular embodiments thereof, many other variations and modifications and other uses will become apparent to those skilled in the art. Therefore, the present invention is not limited by the specific disclosure herein.

What is claimed is:

1. An adaptive dead-time circuit for an oscillator-driven half-bridge circuit, comprising:
   a sensing circuit for sensing a voltage at a midpoint of a switching half-bridge, the switching half-bridge having a high side and a low side transistor connected at said midpoint, the high side transistor driven by a high side driver and the low side transistor driven by a low side driver;
   a first circuit for generating a first signal indicative of a high to low transition of said voltage;
   a second circuit for generating a second signal indicative of a low to high transition of said voltage; and
   an output circuit for generating an adaptive dead-time output signal;
   wherein said output circuit generates said adaptive dead-time output signal based on both said second signal and said first signal;
   wherein said first circuit generates a first pulse near the beginning of said high-to-low transition and a second pulse near the end of said transition, and generates said first signal based on said first and second pulses; and
   wherein said second circuit generates said second signal by reproducing said first signal; and
   wherein said sensing circuit for sensing the voltage at the midpoint of the switching half-bridge comprises:
   a high voltage device, coupled to the midpoint of the switching half-bridge to provide a detection voltage related to the voltage at the midpoint of the switching half-bridge;
   said high voltage device comprising a level shifting transistor that level shifts the voltage at said midpoint of the switching half-bridge to the detection voltage, said detection voltage having a range between zero volts and a power supply voltage for the low side driver; and
   a voltage detection output circuit coupled to the high voltage device for receiving the detection voltage and outputting a signal to contribute to operation of the half-bridge circuit to avoid hard-switching.

2. A circuit as in claim 1, wherein said first circuit generates said first signal by charging a capacitor in response to said first and second pulses to generate a charge indicative of said high-to-low transition, and said second circuit generates said second signal by charging a second capacitor to generate a charge corresponding to said charge on said first capacitor, thereby indicating said low-to-high transition; and
   said output circuit generates said adaptive dead-time output signal in response to said charges on said first and second capacitors, whereby said output signal is responsive to said high-to-low and low-to-high transitions at said half-bridge midpoint.

3. A circuit as in claim 1, wherein said first circuit generates said first signal by charging a capacitor in response to said high-to-low transition to generate a charge indicative of said high-to-low transition, and said second circuit generates said second signal by charging a second capacitor to generate a charge corresponding to said charge on said first capacitor, thereby indicating said low-to-high transition; and
   said output circuit generates said adaptive dead-time output signal in response to said charges on said first and second capacitors, whereby said output signal is responsive to said high-to-low and low-to-high transitions at said half-bridge midpoint.

4. The circuit according to claim 1, wherein the high voltage device is a MOSFET.

5. The circuit according to claim 1, wherein the high voltage device is actuated when a high side switch in the switching half-bridge is turned off.

6. A method of generating an adaptive dead-time signal for an oscillator-driven half-bridge circuit, comprising the steps of:

sensing a voltage at a midpoint of a switching half-bridge, the switching half-bridge having a high side and a low side transistor connected at said midpoint, the high side transistor driven by a high side driver and the low side transistor driven by a low side driver;

generating a first signal indicative of a high to low transition of said voltage;

generating a second signal indicative of a low to high transition of said voltage; and generating an adaptive dead-time output signal;

wherein said adaptive dead-time output signal is generated based on both said second signal and said first signal;

wherein said first signal is generated by the steps of generating a first pulse near the beginning of said high-to-low transition and a second pulse near the end of said transition, and generating said first signal based on said first and second pulses; and wherein said second signal is generated by reproducing said first signal; and wherein said sensing step comprises the steps of:

coupling a high voltage device to the midpoint of the switching half-bridge to provide a detection voltage on the high voltage device related to the voltage at the midpoint of the switching half-bridge;

providing a level shifting transistor of said high voltage device for level shifting the voltage at said midpoint of the switching half-bridge to the detection voltage, said detection voltage having a range between zero volts and a power supply voltage for the low side driver; and supplying a signal based on the detection voltage sensed by the high voltage device to indicate when the voltage at the midpoint of the switching half-bridge has attained a value sufficient to avoid hard-switching when a low side switch of the switching half-bridge is turned on.

7. A circuit as in claim 6, wherein said first signal is generated by charging a capacitor in response to said first and second pulses to generate a charge indicative of said high-to-low transition, and said second signal is generated by charging a second capacitor to generate a charge corresponding to said charge on said first capacitor, thereby indicating said low-to-high transition; and said adaptive dead-time output signal is generated in response to said charges on said first and second capacitors, whereby said output signal is responsive to said high-to-low and low-to-high transitions at said half-bridge midpoint.

8. A method as in claim 6, wherein said first signal is generated by charging a capacitor in response to said high-to-low transition to generate a charge indicative of said high-to-low transition, and said second signal is generated by charging a second capacitor to generate a charge corresponding to said charge on said first capacitor, thereby indicating said low-to-high transition; and said adaptive dead-time output signal is generated in response to said charges on said first and second capacitors, whereby said output signal is responsive to said high-to-low and low-to-high transitions at said half-bridge midpoint.

9. The method according to claim 6, further comprising the step of providing a MOSFET as the high voltage switching device.

10. The method according to claim 6, further comprising the step of actuating the high voltage device when a high side switch in the switching half-bridge is turned off.

11. An adaptive dead-time circuit for an oscillator-driven half-bridge circuit, comprising:

a sensing circuit for sensing a voltage at a midpoint of a switching half-bridge, the switching half-bridge having a high side and a low side transistor connected at said midpoint, the high side transistor driven by a high side driver and the low side transistor driven by a low side driver;

a first circuit for generating a first signal indicative of a high to low transition of said voltage;

an output circuit for generating an adaptive dead-time output signal based at least on said first signal, for controlling said oscillator;

wherein said sensing circuit for sensing a voltage at a midpoint of a switching half-bridge comprises:

a high voltage device coupled to the midpoint of the switching half-bridge to provide a detection voltage related to the voltage at the midpoint of the switching half-bridge;

said high voltage device comprising a level shifting transistor that level shifts the voltage at said midpoint of the switching half-bridge to the detection voltage, said detection voltage having a range between zero volts and a power supply voltage for the low side driver; and a voltage detection output circuit coupled to the high voltage device for receiving the detection voltage and outputting a signal to contribute to operation of the half-bridge circuit to avoid hard-switching based on the voltage at the midpoint of the half-bridge circuit.

12. The circuit according to claim 11, wherein the high voltage device is a MOSFET.

13. The circuit according to claim 11, wherein the high voltage device is actuated when a high side switch in the switching half-bridge is turned off.

14. A method of generating an adaptive dead-time signal for an oscillator-driven half-bridge circuit, comprising the steps of:

sensing a voltage at a midpoint of a switching half-bridge, the switching half-bridge having a high side and a low side transistor connected at said midpoint, the high side transistor driven by a high side driver and the low side transistor driven by a low side driver;

generating a first signal indicative of a high to low transition of said voltage; and generating an adaptive dead-time output signal based at least on said first signal, for controlling said oscillator; and wherein said sensing step comprises steps of:

coupling a high voltage device to the midpoint of the switching half-bridge to provide a detection voltage on the high voltage device related to the voltage at the midpoint of the switching half-bridge;

providing a level shifting transistor of said high voltage device for level shifting the voltage at said midpoint of the switching half-bridge to the detection voltage, said detection voltage having a range between zero volts and a power supply voltage for the low side driver; and supplying a signal based on the detection voltage sensed by the high voltage device to indicate when the voltage at the midpoint of the switching half-bridge has attained a value sufficient to avoid hard-switching when a low side switch of the switching half-bridge is turned on.

15. The method according to claim 14, further comprising the step of providing a MOSFET as the high voltage switching device.

16. The method according to claim 14, further comprising the step of actuating the high voltage device to register the detection voltage when a high side switch in the switching half-bridge is turned off.

\* \* \* \* \*